United States Patent
Engel et al.

(10) Patent No.: US 6,478,212 B1
(45) Date of Patent: Nov. 12, 2002

(54) BOND PAD STRUCTURE AND METHOD FOR REDUCED DOWNWARD FORCE WIREBONDING

(75) Inventors: Brett H. Engel, Fishkill, NY (US); Vincent James McGahay, Poughkeepsie, NY (US); Henry Atkinson Nye, III, Brookfield, CT (US)

(73) Assignee: International Business Machines Corporation, Armonk, NY (US)

( * ) Notice: Subject to any disclaimer, the term of this patent is extended or adjusted under 35 U.S.C. 154(b) by 2 days.

(21) Appl. No.: 09/760,955

(22) Filed: Jan. 16, 2001

(51) Int. Cl.[7] .......................... B23K 37/00; B23K 31/00
(52) U.S. Cl. ...................... 228/5.7; 228/4.5; 228/180.5
(58) Field of Search ...................... 228/1.1, 4.5, 5.7, 228/6.2, 904, 110.1, 174, 179.1, 180.5; 257/784, 786

(56) References Cited

U.S. PATENT DOCUMENTS

| 3,648,014 A | * | 3/1972 | Bennett ..................... 219/118 |
| 4,860,941 A | | 8/1989 | Otto ........................... 228/179 |
| 4,893,742 A | * | 1/1990 | Bullock ................. 219/121.63 |
| 5,269,452 A | | 12/1993 | Sterczyk .................... 228/49.2 |
| 5,396,104 A | * | 3/1995 | Kimura .................... 174/110 N |
| 5,598,096 A | | 1/1997 | Pham et al. ............. 324/158.1 |
| 5,601,740 A | | 2/1997 | Eldridge et al. ......... 219/130.4 |
| 5,626,276 A | | 5/1997 | Lo et al. ....................... 228/4.5 |
| 5,632,438 A | | 5/1997 | Hoffmeyer et al. ...... 228/180.5 |
| 5,698,903 A | | 12/1997 | Parris et al. ................ 257/786 |
| 5,775,567 A | | 7/1998 | Lo et al. ....................... 228/1.1 |
| 5,796,549 A | | 8/1998 | Sedbrook et al. .......... 360/103 |
| 5,905,308 A | | 5/1999 | Efland et al. ................ 257/786 |
| 5,920,081 A | | 7/1999 | Chen et al. .................... 257/48 |
| 5,923,088 A | | 7/1999 | Shiue et al. ................. 257/758 |
| 5,986,343 A | | 11/1999 | Chittipeddi et al. ........ 257/758 |
| 6,031,293 A | * | 2/2000 | Hsuan et al. ............... 257/698 |
| 6,079,610 A | | 6/2000 | Maeda et al. ............ 228/180.5 |
| 6,085,962 A | | 7/2000 | Jacobson et al. ........... 228/103 |
| 6,105,846 A | | 8/2000 | Evers et al. ................. 228/4.5 |
| 6,126,062 A | | 10/2000 | Evers et al. ................ 228/212 |
| 6,138,891 A | | 10/2000 | Evers et al. ............... 228/44.7 |
| 6,139,977 A | | 10/2000 | Abys et al. ................. 428/615 |
| 6,242,813 B1 | * | 6/2001 | Huang et al. ............... 257/758 |

\* cited by examiner

Primary Examiner—Tom Dunn
Assistant Examiner—Zidia Pittman

(57) ABSTRACT

A bond pad structure for an integrated circuit has bondable base member for receiving a wire bonded thereon. A cavity is formed within the base member, with the cavity being configured to capture the wire therein. The cavity has one end having a first width and an opposite end having a second width, with the first width being greater than second width.

21 Claims, 9 Drawing Sheets

BOND PAD STRUCTURE AND METHOD FOR REDUCED DOWNWARD FORCE WIREBONDING

BACKGROUND OF THE INVENTION

The invention relates to wirebonding and, more particularly, to an apparatus and method for reduced downward force wirebonding of integrated circuits.

Recent advances in integrated circuit technology have brought about the incorporation of low dielectric constant (low-k) dielectrics into the devices. However, these copper/low-k materials are particularly susceptible to oxidation as the result of passivation damage, which is associated with activities such as handling, probing, and wirebonding. Wirebonding is the most common technology used in the electronic packaging industry for making electrical connections between the electrode pads on an integrated circuit chip and wires extending to a substrate providing external connections to the chip. Two examples of known wirebonding methods are "ball bonding" and "wedge bonding".

Ball bonding is a process by which a wire is fed through and protrudes from a capillary hole in a bonding head. An electric arc melts the protruding wire into a ball which then solidifies. The solidified ball is pressed and flattened onto a bond pad by a bonding head. The ball/bond pad surface interface is then subjected to ultrasonic vibrations to form an electrical bond therebetween. In wedge bonding, a wedge feeds a wire through a clamp. Ultrasonic energy may then be used to bond the wire to a contact surface to form a first bond. The wedge is raised, forming a wire loop, and moves to a second bond site where a second bond is formed. The clamp thereafter pivots away from the tool to break the wire at the second bond.

Both ball bonding and wedge bonding are techniques which involve the application of a downward or normal force directly on the bond surface in order to successfully achieve an electrically sound bond between the wire and the bond surface. However, the downward force applied to the bond surface can cause damage to a passivation layer, frequently resulting in the oxidation of underlying metal therein. It is desirable, therefore to provide a method and/or apparatus which operates to reduce the amount of downward force applied to a bond surface.

SUMMARY OF THE INVENTION

In an exemplary embodiment of the invention, a bond pad structure for an integrated circuit has a bondable base member for receiving a wire bonded thereon. A cavity is formed within the base member, with the cavity being configured to capture the wire therein. The cavity has a first open end having a first width and a second open end having a second width, with the first width being greater than second width. In a preferred embodiment, the cavity is tapered from one end to the opposite end, and is trapezoidally shaped. The base member is preferably comprised of an electrically conducting material, such as aluminum.

BRIEF DESCRIPTION OF THE DRAWINGS

FIG. 9b is an opposite end view of FIG. 9a;

DETAILED DESCRIPTION OF THE PREFERRED EMBODIMENT

Figure 1:
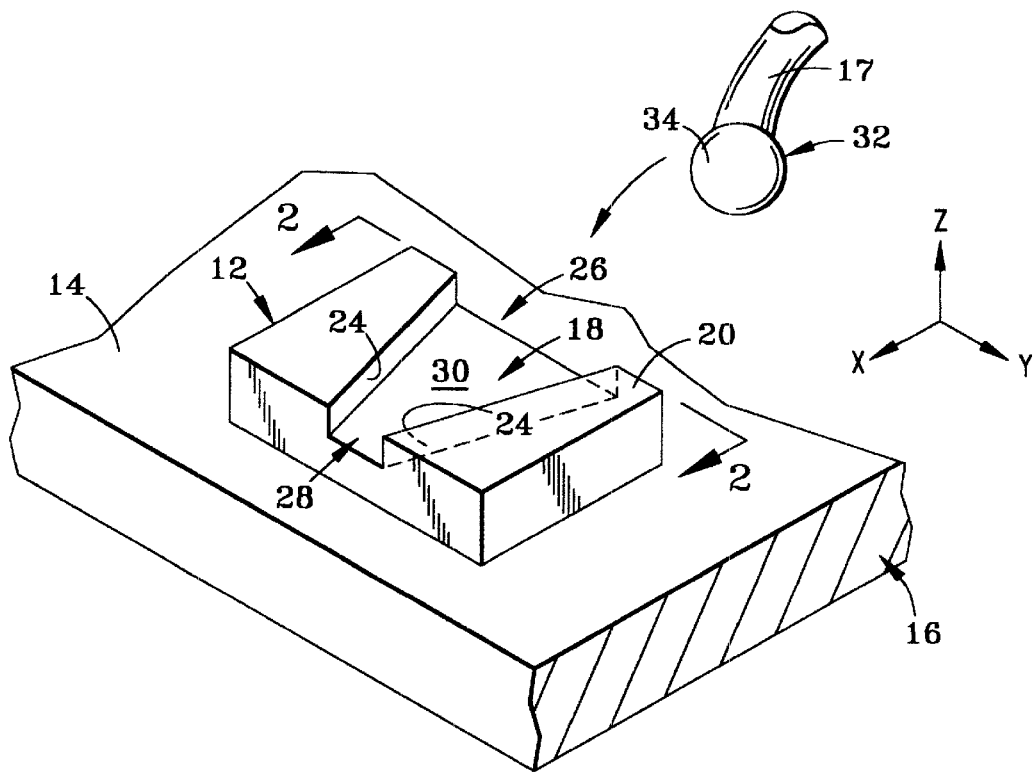
FIG. 1 illustrates a perspective view of a wire and a bond pad structure having a trapezoidal shaped cavity therein, in accordance with one embodiment of the invention.

FIG. 1 illustrates an embodiment of a bond pad structure 10 having a base member 12 formed upon a substrate 14 of an integrated circuit 16. It will be understood that the integrated circuit 16 may include a number of bond pad structures 10 for electrically coupling the integrated circuit 16 to another device (not shown) such as a lead frame, interposer or printed circuit board. The base member 12 is preferably formed of a material, such as aluminum, which is electrically and mechanically bondable to a wire 17 engageable thereon. While the base member 12 depicted in the present embodiment is generally square shaped, it should be understood that other shapes and thicknesses may be employed in the pad structure.

In the embodiment shown in FIGS. 1 through 4, a trapezoidal shaped cavity 18 is formed within the top surface 20 of the base member 12, creating a pair of internal side walls 24 beginning at a first open end 26 of the cavity 18 and tapering inwardly to a second open end 28 of cavity 18. It will also be noted that the depth of cavity 18 in this embodiment is less than the overall thickness (height) of base 12, resulting in the creation of a floor 30 within cavity 18. The width of the first open end 26, designated by the distance "b" in FIG. 4, should be large enough so as to accommodate the tip 32 of wire 17 completely within the cavity 18 upon the initial insertion of wire 17 therein. The width of the second open end 28, designated by the distance "a" in FIG. 4, should be small enough so as to prevent the tip 32 of wire from sliding out after the insertion process is completed.

The tip 32 of the bond wire 17 is preferably larger than the diameter of the remaining length of wire. In the embodiment depicted in FIGS. 1 through 4, wire tip 32 comprises a balled or spherical end 34 which may be formed by electric arc melting, as described earlier. Other wire tip embodiments are also contemplated, and are described in greater detail hereinafter.

Using prior art methods of wire bonding, wire 17 would be forced downwardly in the negative z-axis direction (FIG. 1) onto the flat surface in the base member 12 defined by floor 30. However, in the present embodiment and method, the tip 32 of wire 17 need only come into slight contact with floor 30 before wire 17 is pulled horizontally through cavity 18 in the x-axis direction. Because side walls 24 taper inwardly along the x-axis direction, the wire tip 32 eventually lodges securely in between sidewalls 24 as it is pulled toward the narrower second open end 28. Electrical contact is thereby made between wire tip 32 and base member 12 on three surfaces. Thererafter, the final bonding process may include the application of ultrasound energy to the wire tip 32 and the base member 12. A fusing laser may also be used to apply heat to the wire tip 32 and base member 12.

Figure 5A:
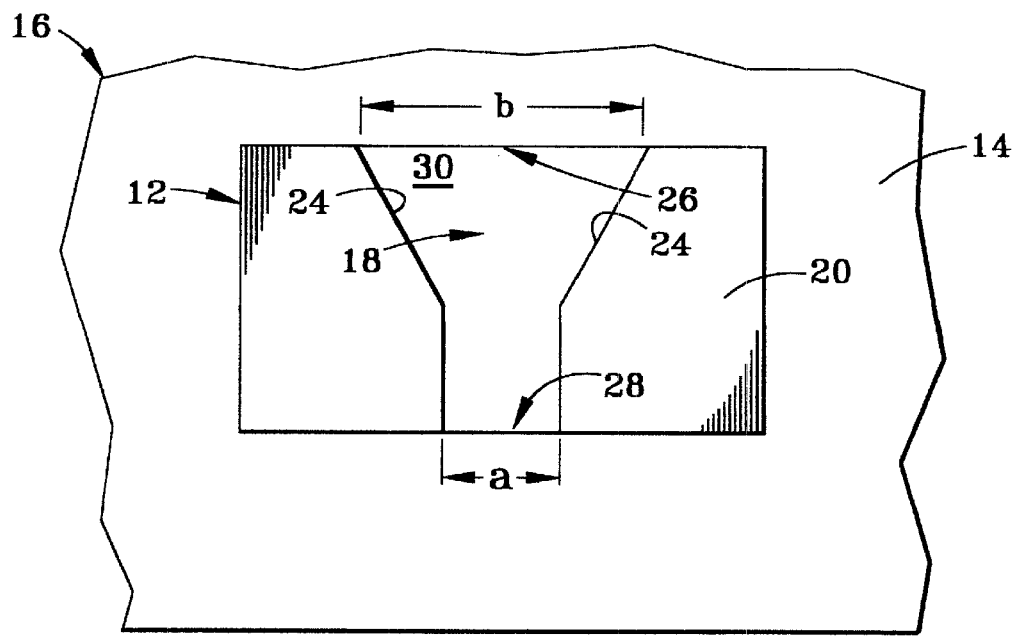
FIGS. 5a and 5b are alternative embodiments of the cavity configuration within the bond pad structure in FIG. 4.
Figure 5B:
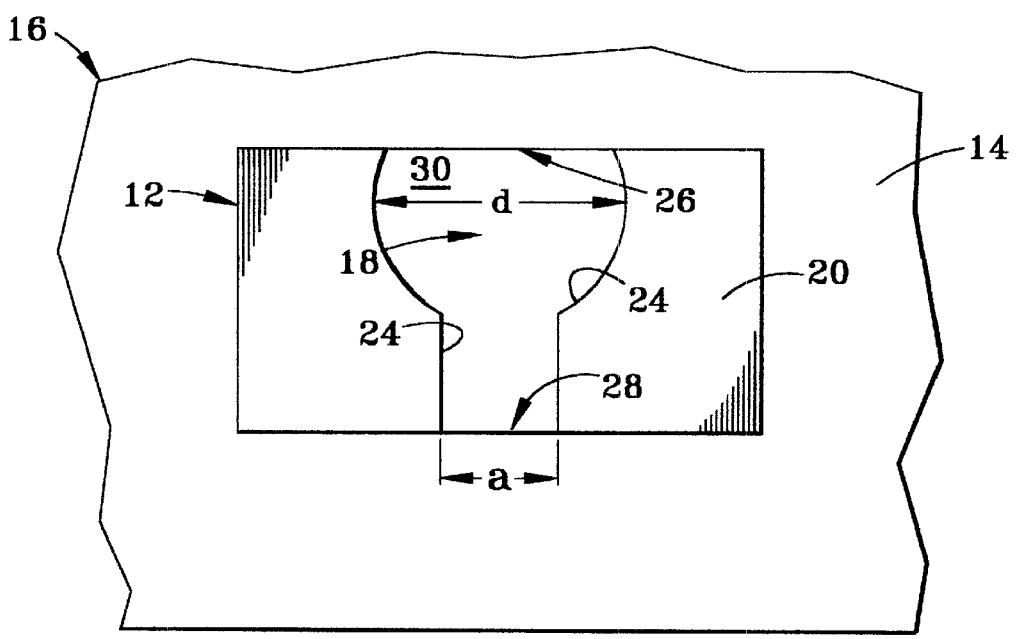

FIGS. 5a and 5b are embodiments of alternative cavity configurations which formed within the base member 12. Although the cavity 18 in FIG. 5b does not have linearly shaped side walls, it will nonetheless be appreciated that the circular portion of cavity includes a diameter "d" which should be dimensioned large enough to initially accommodate the tip 32 of wire therein.

Figure 6A:
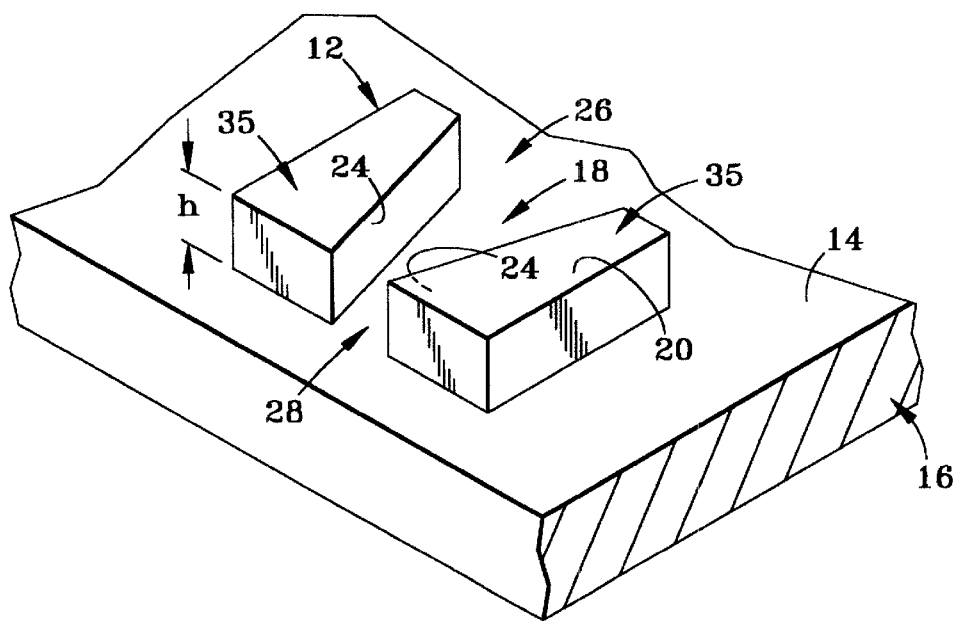
FIGS. 6a through 6c are alternative embodiments of the trapezoidal cavity shape shown in FIG. 1.
Figure 6B:
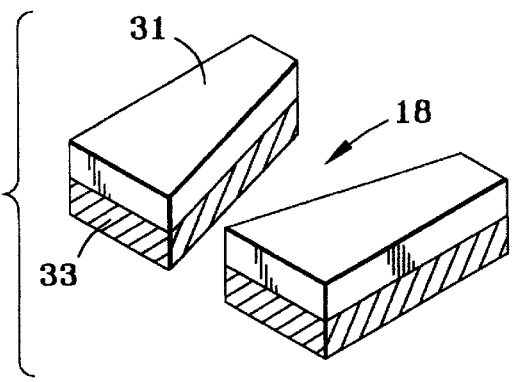
Figure 6C:
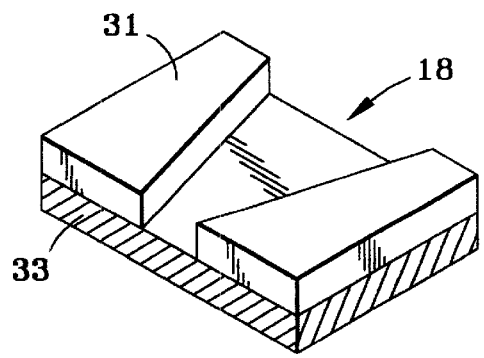
Figure 6D:
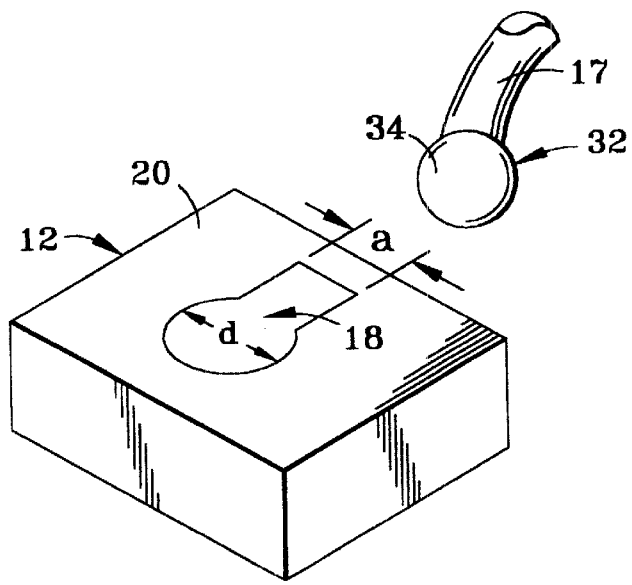
FIGS. 6d is a perspective view of another embodiment of the invention.

FIGS. 6a, 6b and 6c depict alternative embodiments of the trapezoidal shaped cavity 18. In FIG. 6a, it is seen that the cavity 18 is formed through the entire thickness "h" of the base member 12, resulting in the base member 12 being comprised of two separate blocks 35 of conducting material. In this embodiment, the tip 32 of wire 17 will be bonded to two surfaces (side walls 26) instead of three surfaces (side walls 24 and floor 30). As shown in FIGS. 6b and 6c, the base member 12 may also be comprised of both conducting material 31, as well as a dielectric base material 33. Cavity 18 may be formed through the dielectric material 33 as shown in FIG. 6b or, in the alternative, cavity 18 may be formed only through the conducting material 31 as shown in FIG. 6d. It should also be noted that the dielectric material 33, if so desired, may be disposed atop conducting material 31.

Figure 7A:
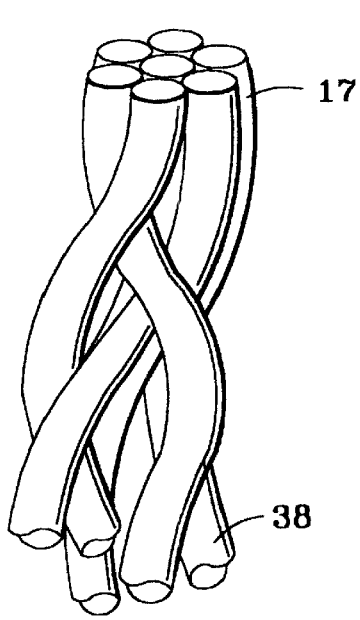
FIGS. 7a, 7b and 7c are alternative embodiments of the bond wire configuration.
Figure 7B:
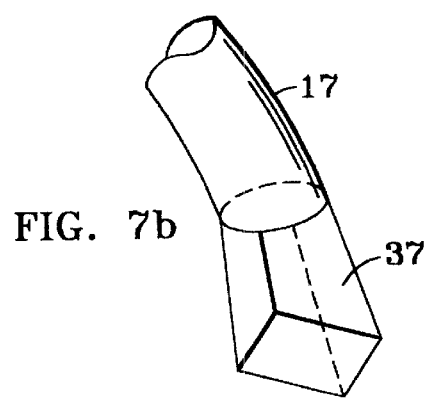
Figure 7C:
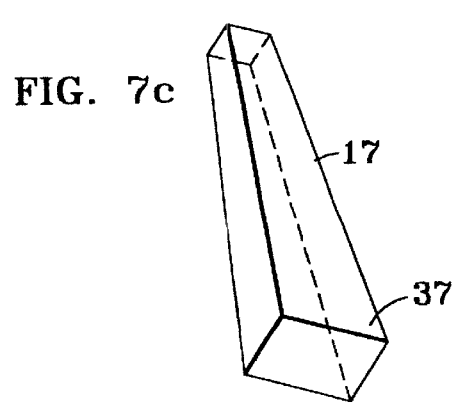

FIG. 6d depicts yet another embodiment of the bond pad structure 10. Cavity 18 has a "keyhole" configuration and is formed within the top surface 20 of base member 12. In this embodiment, the interior of base member 12 may be hollow. As is the case with the embodiment shown in FIG. 5b, the circular portion of cavity 18 has an inside diameter "d" which is large enough to accommodate the tip 32 of wire 17 therein. Again, the narrow portion of cavity 18, has a width "a" which is dimensioned to capture and 25 retain tip 32. FIGS. 7a, 7b and 7c illustrate alternative embodiments of the bond wire 17. In FIG. 7a, the wire 17 is shown braided and frayed at the tip 32 thereof. Individual strands 38 may be inserted into the larger open end of cavity 18 of any of the embodiments of bond pad structure 10 shown herein. As with a balled tip, the strands 38 of braided wire 17 may be wedged and bonded to the narrower end of cavity 18.

Figure 8A:
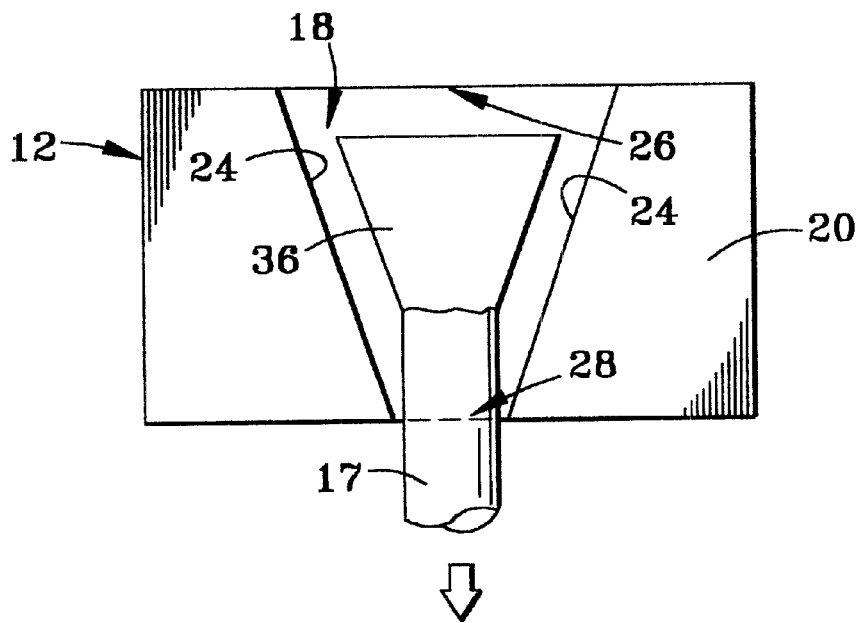
FIGS. 8a and 8b are a top plan view of the bond pad structure in FIG. 4, illustrating the initial insertion and final position of the wire embodiment of FIG. 7a within the bond pad structure.
Figure 8B:
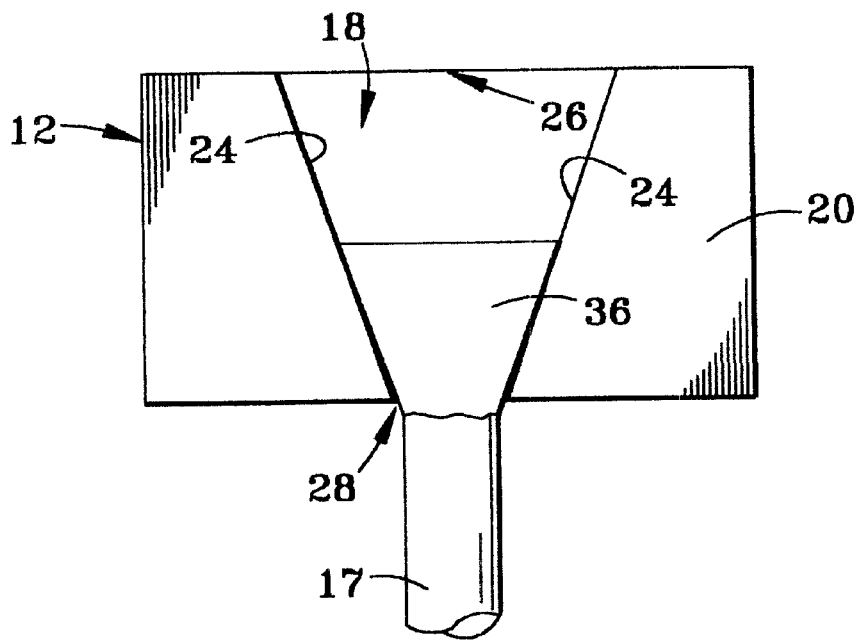
Figure 9A:
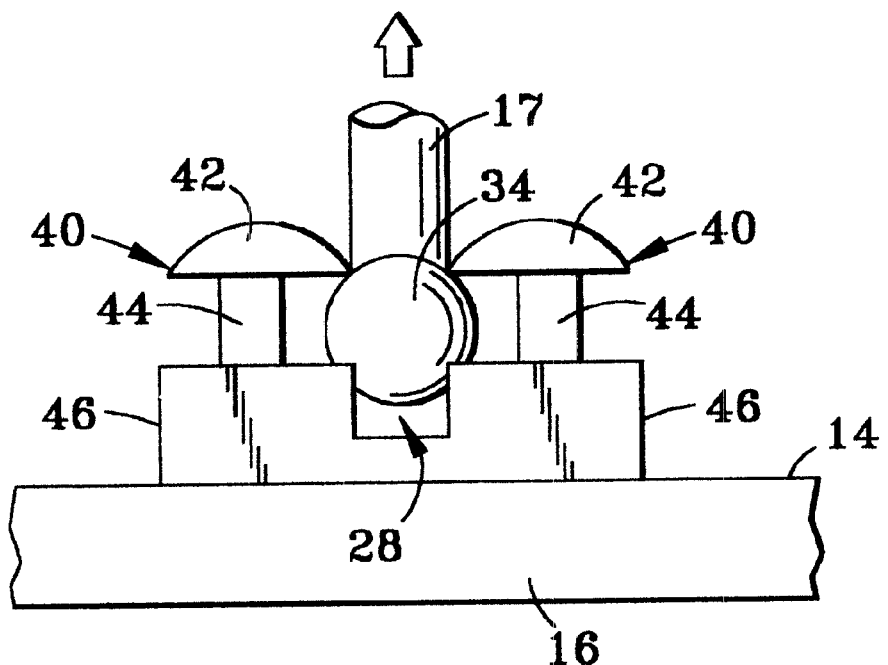
FIG. 9a is an end view an alternative embodiment of the bond pad structure in FIGS. 1—4, illustrating a stop structure used to prevent the vertical removal of the bond wire from the bond pad structure.
Figure 9B:
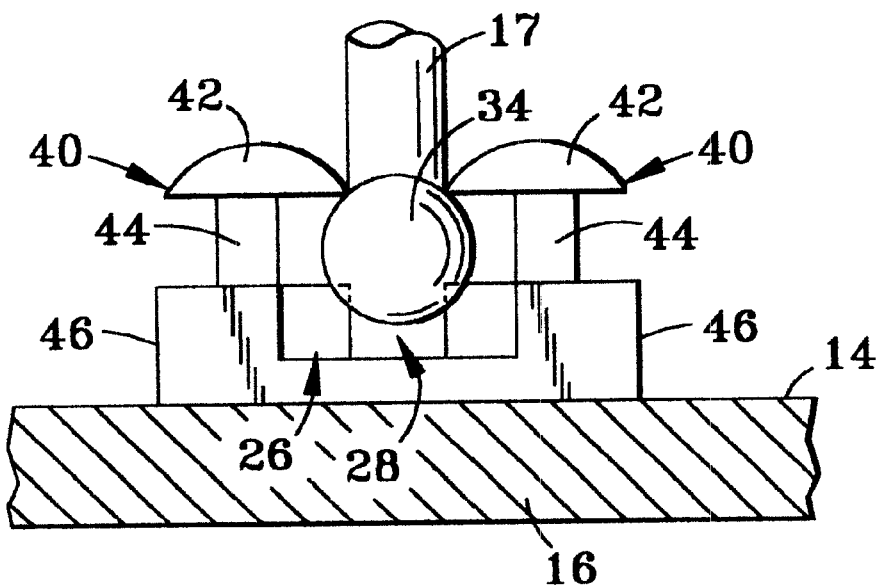
Figure 9C:
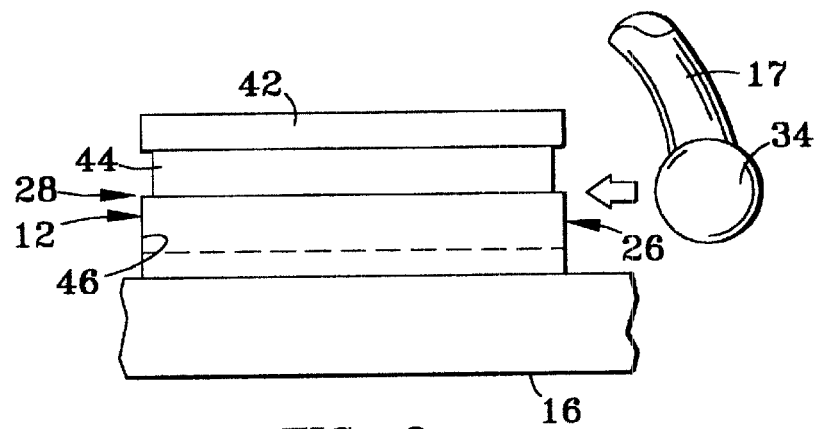
FIG. 9c is a side elevational view of FIG. 9a, illustrating the initial direction of the insertion of the bond wire into the bond pad structure.
Figure 9D:
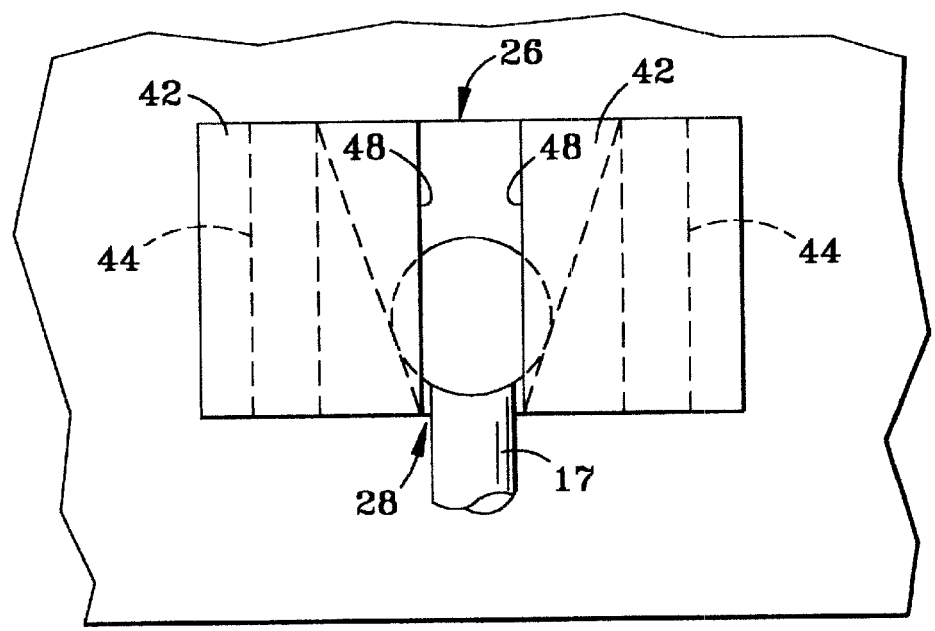
FIG. 9d is a top view of FIG. 9a, illustrating the final position of the wire within the bond pad structure.

Refering now to FIG. 7b, wire 17 stamped at the end thereof to form a flanged tip 36, which is generally trapezoidally shaped to correspond with the inner walls of cavity 18. Similarly, the wire embodiment in FIG. 7c is also generally trapezoidally shaped, but features a gradual outwardly tapering tip 37 as opposed to a stamped flanged tip 36. The engagement of the wire embodiment in FIG. 7a into cavity 18 is illustrated in FIGS. 8a and 8b. As is the case with the balled tip 34 embodiment of wire 17, a flanged tip 36 configuration having a generally trapezoidal shape will lodge securely within cavity side walls 24 when pulled horizontally through cavity 18, setting the stage for final ultrasonic or laser bonding.

FIGS. 9a–9d illustrate the use of pair of stop structures 40 disposed on top of the base member 12. Each stop structure 40 features a semi circular or mushroom shaped roof member 42, supported by a rail 44 running parallel to the outer edges 46 of base member 12. The roof members 42 are designed such that the wire 17 is not accidentally withdrawn from cavity 18 in the vertical z-axis direction once initially inserted. It is best seen from FIG. 9d that the roof members 42 have inner edges 48 which are parallel and are spaced apart by a distance which is slightly greater than, or equal to, the width of the second open end 28 of cavity 18. In either case, the distance between roof members 42 is less than the width of the first open end 26. Thus configured, the wire 17 may freely pass horizontally within cavity 18 and in between roof members 42. At the same time, roof members 42 prevent vertical removal of wire 17 from cavity 18 by coming into contact with wire tip 32, which has a larger thickness than the main body of wire 17.

It should be noted that although roof members 42 in the embodiment of FIGS. 9a–9d have a rounded top surface, they may also comprise a rectangular, or flat surfaced structure. It should also be noted that the height of rails 44 supporting roof members 42 should be selected such that the stop structures 40 do not prevent the insertion of wire tip 32 into the first open end 22 of cavity 18 in a horizontal direction. In yet another embodiment, circular posts (not shown) may be used in lieu of rectangular rails 44 to support the roof members 42. Roof members 42 may also be embodied by a circular structure (not shown) as viewed from the top down. In still another embodiment, both the rails 44 (whether rectangular or circular posts) and the roof members may be integrally formed from base member 12 (not shown).

Figure 2:
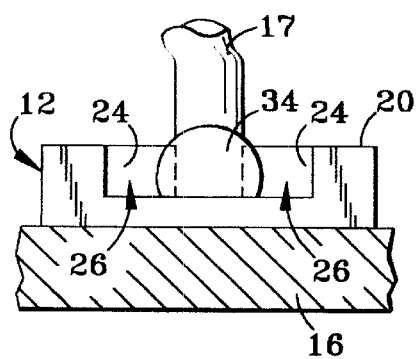
FIG. 2 is an end view of the bond pad structure, taken along lines 2—2 in FIG. 1, illustrating the insertion and bonding of the wire within the bond pad structure.
Figure 3:
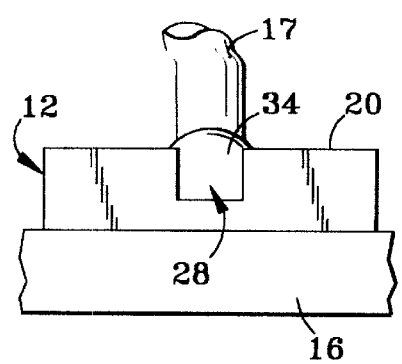
FIG. 3 is an opposite end view of the bond pad structure, illustrating the insertion of the wire within the bond pad structure.
Figure 4:
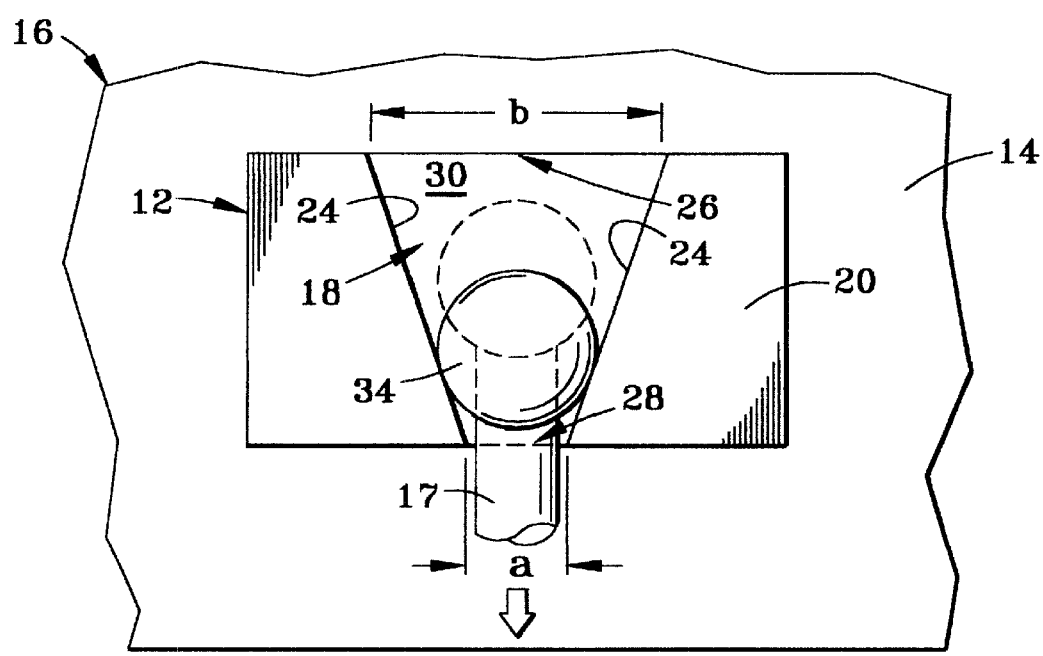
FIG. 4 is a top plan view of the bond pad structure, illustrating the initial insertion and final position of the wire within the bond pad structure.
Figure 10A:
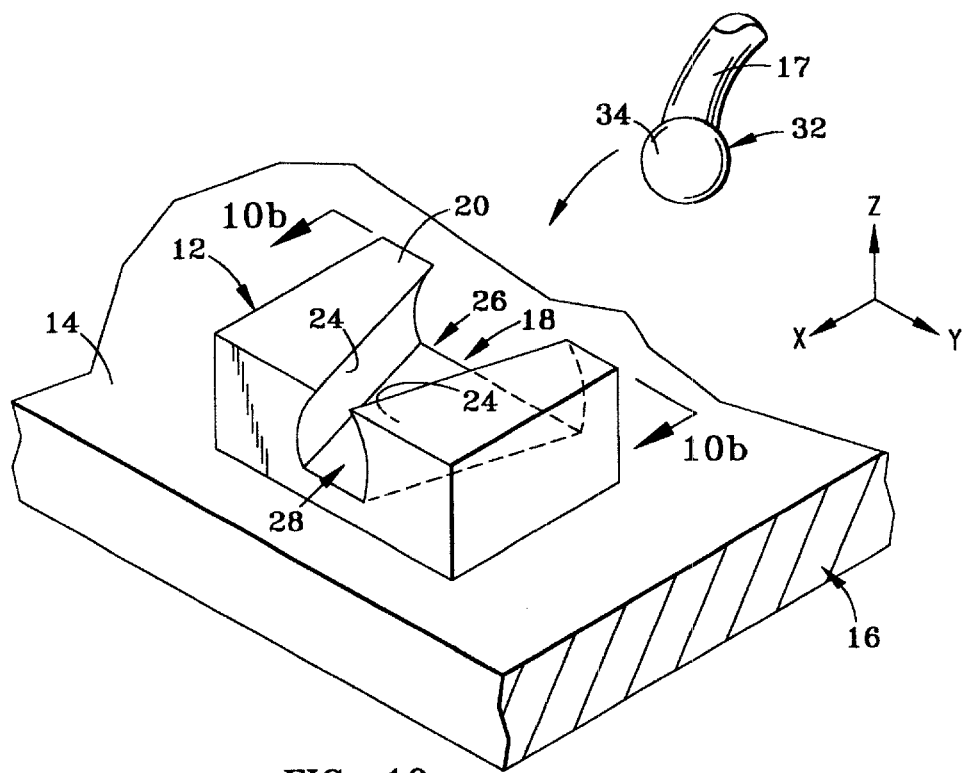
FIGS. 10a, 10b and 10c depict alternative embodiments of the bond pad structure and stop structure integrated therein.
Figure 10B:
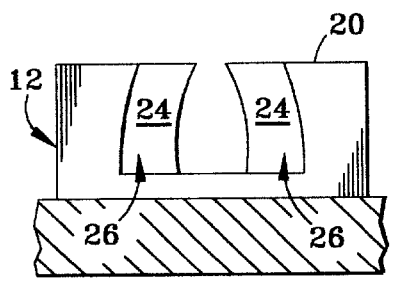
Figure 10C:
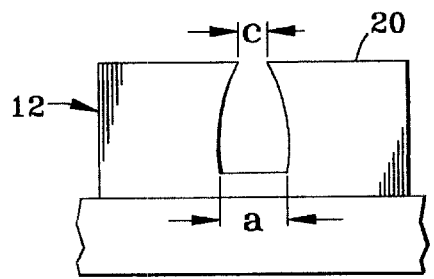

Referring now to FIGS. 10a, 10b and 10c, an alternative embodiment of FIGS. 1–3 is depicted, wherein the stop surface structure 40 features of FIGS. 9a—9d are incorporated therein. As can be seen in FIGS. 10a–10c, sidewalls 24 are formed in a fashion such that the distance "c" between sidewalls 24 at the top of second open end 28 is less than the distance "a" at the bottom of second open end 28. Put another way, the cavity 18 is narrower along the top surface 20 of base member 12 than it is along the floor 30 of base member 12. Thus configured, the top of cavity 18, being narrower than along the bottom thereof, may prevent the removal of wire 17 along the z-axis following initial insertion into cavity 18.

Referring generally now to the Figures, the base member 12 of bond pad structure 10 may be formed on substrate 16 through ordinary chemical deposition and etching techniques. Specifically, the cavity 18 structure may be formed by etching out the metallic material comprising the base member 12. Cavity 18 may also be formed by the deposition and removal of an organic sacrificial layer, patterned in the configuration of the desired cavity pattern. As stated earlier, a dielectric material 33 (FIGS. 6b and 6c) may also be deposited upon, or layered within the base member 12 as needed. In such a case, the cavity 18 would preferably be formed through both the conducting material and any dielectric material layers contained in base member 12.

From the foregoing description, it is seen that by forming a cavity 18 within a bond pad structure 10 and further configuring the cavity 18 to have a wide end 26 and a narrow end 28, the narrow end 28 of the cavity will capture 18 the wire 17 following the application of a horizontal pulling force. As opposed to applying a substantial downward force, which may lead to the problems and complications discussed above, the horizontal pulling motion reduces the amount of downward, or normal force applied to the bond pad structure 10. An additional benefit of the embodiments of the described invention is an improved joint strength at the wire tip/bond pad interface.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment or embodiments disclosed as the best mode contemplated for carrying out this invention, but that the invention will include all embodiments falling within the scope of the appended claims.

What is claimed is:

1. A bond pad structure for an integrated circuit, said bond pad structure comprising;
   a cavity formed within said base member, said cavity configured to capture said wire therein;
   said cavity further comprising a first open end having a first width and a second open end having a second width, wherein said first width is greater than said second width; and
   a stop structure disposed on top of said base member, said stop structure preventing sad wire from being vertically removed from said cavity once said wire is initially inserted into said first end of said cavity.

2. The bond pad structure of claim 1, wherein said cavity is tapered from said first open end to said second open end.

3. The bond pad structure of claim 1, wherein said cavity is trapezoidally shaped.

4. The bond pad structure of claim 1, wherein said base member further comprises an electrically conducting material.

5. The bond pad structure of claim 4, wherein said base member is further comprised of aluminum.

6. The bond pad structure of claim 1, wherein said first open end of said cavity is circular shaped.

7. The bond pad structure of claim 1, wherein said wire further comprises a spherical tip formed at the end of said wire.

8. The bond pad structure of claim 1, wherein said wire further comprises a flanged tip formed at the end of said wire.

9. The bond pad structure of claim 1, wherein said wire further comprises a braided wire.

10. The bond pad structure of claim 1, wherein said stop structure further comprises a pair of roof members disposed parallel to one another.

11. The bond pad structure of claim 10, wherein a distance which separates said pair of roof members is less than said first width and greater than or equal to said second width.

12. A bond pad structure for an integrated circuit, said bond pad structure comprising;
    a bondable base member for receiving a wire to be bonded thereon; and
    a cavity formed within said base member, said cavity configured to capture said wire therein;
    said cavity further comprising a first open end having a first width and a second open end having a second width, wherein said first width is greater than said second width; and
    a stop structure integral to said base member, said stop structure preventing sad wire from being vertically removed from said cavity once said wire is initially inserted into said first end of said cavity.

13. The bond pad structure of claim 12, wherein said cavity is tapered from said first open end to said second open end.

14. The bond pad structure of claim 12, wherein said cavity is trapezoidally so.

15. The bond pad structure of claim 12, wherein said base member further comprises an electrically conducting material.

16. The bond pad structure of claim 15, wherein said base member is further comprised of aluminum.

17. The bond pad structure of claim 12, wherein said first open end of said cavity is circular shaped.

18. The bond pad structure of claim 12, wherein said wire further comprises a spherical tip formed at the end of said wire.

19. The bond pad structure of claim 12, wherein said wire further comprises a flanged tip formed at the end of said wire.

20. The bond pad structure of claim 12, wherein said stop structure further comprises a pair of roof members disposed parallel to one another.

21. The bond pad structure of claim 20, wherein a distance which separates said pair of roof members is less tan said first width and greater than or equal to said second width.

* * * * *